(12) United States Patent
Fujiki et al.

(10) Patent No.: US 6,194,228 B1
(45) Date of Patent: Feb. 27, 2001

(54) ELECTRONIC DEVICE HAVING PEROVSKITE-TYPE OXIDE FILM, PRODUCTION THEREOF, AND FERROELECTRIC CAPACITOR

(75) Inventors: Mitsushi Fujiki; Jeffrey S. Cross; Mineharu Tsukada, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/175,977

(22) Filed: Oct. 21, 1998

(30) Foreign Application Priority Data

Oct. 22, 1997 (JP) .................................................. 9-290079
Oct. 15, 1998 (JP) ................................................. 10-293698

(51) Int. Cl.$^7$ .................................................. H01L 21/00
(52) U.S. Cl. .............................. 438/3; 438/240; 438/608
(58) Field of Search ........................... 438/3, 239, 240, 438/393, 396, 398, 399, 608, 609, 652, 653, 654

(56) References Cited

U.S. PATENT DOCUMENTS

| 4,316,785 | * | 2/1982 | Suzuki et al. | 204/192.2 |
| 5,434,102 | * | 7/1995 | Watanabe et al. | 438/3 |
| 5,440,173 | * | 8/1995 | Evans, Jr. et al. | 257/751 |
| 5,489,548 | * | 2/1996 | Nishioka et al. | 438/396 |
| 5,589,284 | | 12/1996 | Summerfelt et al. | 428/697 |
| 5,728,603 | * | 3/1998 | Emesh et al. | 438/3 |
| 5,838,035 | * | 11/1998 | Ramesh | 257/295 |

FOREIGN PATENT DOCUMENTS

| 1-93088 | * | 4/1989 | (JP) . |
| 5-206382 | | 8/1993 | (JP) . |
| 6-151601 | | 5/1994 | (JP) . |
| 9-82902 | | 3/1997 | (JP) . |
| 9-82906 | | 3/1997 | (JP) . |

* cited by examiner

Primary Examiner—Carl Whitehead, Jr.
Assistant Examiner—Jeff Vockrodt
(74) Attorney, Agent, or Firm—Armstrong, Westerman, Hattori, McLeland & Naughton

(57) ABSTRACT

A method of manufacturing an electronic device including an oxide film of perovskite-type, said method comprising the steps of forming on a base substrate a first conductive oxide film of perovskite type in an atmosphere of reduced pressure at a first temperature, and performing heat treatment on the first conductive oxide film in an oxidizing atmosphere containing oxygen at a second temperature which is higher than the first temperature.

45 Claims, 10 Drawing Sheets

ELECTRONIC DEVICE HAVING PEROVSKITE-TYPE OXIDE FILM, PRODUCTION THEREOF, AND FERROELECTRIC CAPACITOR

This application is based on Japanese Patent Application No.9-290079 filed on Oct. 22, 1997, and No.10-293698 filed on Oct. 15, 1998, the entire contents of which are incorporated herein by reference.

BACKGROUND OF THE INVENTION

1. Field of the Invention

The present invention relates to an electronic device having perovskite-type oxide film, a process for producing the same, and a ferroelectric capacitor.

2. Description of the Related Art

Prevailing computers, regardless of their size, have the main memory composed of dynamic random access memory (DRAM) or static random access memory (SRAM) which are of volatile memory. Volatile memory holds data while it is supplied with electric power but loses stored data as soon as the supply of electric power is suspended. By contrast, non-volatile memory holds data even without power supply. One of such non-volatile memory attracting attention is FeRAM which is based on ferroelectrics. The advantage of FeRAM is non-volatility, low power consumption, and capability of high integration density. In addition, because of its greatly improved rewritability, FeRAM is expected to supersede the existing memory and to find use in new applications such as IC card.

The constituent element of FeRAM is a ferroelectric capacitor, which is constructed of a ferroelectric film and two electrodes of platinum (Pt) or the like holding it between them. The ferroelectric film is required to have a high degree of residual polarization, a hysteresis loop with good squareness ratio and low coercive field, and a good fatigue characteristic (or ability to retain polarization even after repeated applications of pulses more than $10^{12}$ times). Its additional requirement is an ability to prevent leak current between capacitor electrodes when it forms a ferroelectric capacitor. Leak current aggravates hysteresis. Another requirement is good (low) imprint characteristics, which is an ability to keep the hysteresis unshifted when the ferroelectric capacitor is kept at a high temperature in its polarized state.

Among known ferroelectric materials suitable for ferroelectric capacitors is known lead titanate zirconate (Pb(Zr, Ti)O$_3$) (abbreviated as PZT hereinafter). PZT is characterized by its comparatively high residual polarization even at room temperature and its sufficiently high Curie point compared to the operating temperature. When used for ferroelectric capacitor of layered structure (Pt/PZT/Pt), PZT suffers so-called fatigue (which is a phenomenon that residual polarization decreases when pulses are applied repeatedly more than $10^6$ times). This is detrimental to reliability.

An FeRAM less subject to fatigue is attracting attention. It is provided with conductive oxide electrodes, such as SrRuO$_3$ (abbreviated as SRO), in place of platinum. These conductive oxide electrodes function as a barrier against diffusion of Pb and prevent the oxygen defects of ferroelectric materials. This is the reason whey they protect ferroelectric film from fatigue.

Ferroelectric capacitors with SRO electrodes have been reported by Argonne National Laboratory in USA and Texas Instruments Corp. (TI) in USA. The one reported by the former is not suitable for mass production because it uses SrTiO$_3$ single crystal as the substrate. The one reported by the latter has PZT film deposited by sol-gel method on the SRO film deposited by high-temperature sputtering. Its disadvantage is that residual polarization is as small as 14.3 $\mu$C/cm$^2$ when the applied voltage is 3V. Another disadvantage is that high-temperature sputtering to deposit SRO film tends to cause oxygen defects (probably due to operation under reduced pressure), which poses a problem with crystallinity, although it yields polycrystalline film (in which crystals are oriented) if the substrate is heated during sputtering.

Furthermore, it is anticipated that it would be difficult to uniformly heat the entire surface of the substrate of large diameter and it would be difficult to form SRO film of good quality on the entire surface of the substrate of large diameter.

Although SRO is a conductive oxide, it has a resistance of 350 $\mu\Omega$cm, which is slightly higher than that of Pt (11 $\mu\Omega$cm). This makes it difficult to establish a good ohmic contact with Ti$_{1-x}$Al$_x$N which forms an adhesion layer when plugs are made of Si or W. Therefore, there is a demand for SRO having bottom resistance.

SUMMARY OF THE INVENTION

It is an object of the present invention to provide an electronic device having a perovskite-type oxide film suitable for mass production.

It is another object of the present invention to provide a process for producing said electronic device.

According to one aspect of the present invention, there is provided a process for producing a layered structure having a PZT thin film, comprising the steps of: forming on the main surface of a base substrate an amorphous SrRuO$_3$ film by sputtering without directly heating the substrate, heating the amorphous SrRuO$_3$ film at a temperature high enough for SrRuO$_3$ to crystallize, thereby polycrystallizing the amorphous SrRuO$_3$ film, forming on the polycrystallized SrRuO$_3$ film a Pb(Zr,Ti)O$_3$ film by sol-gel method, and heating the Pb(Zr,Ti)O$_3$ film at a temperature high enough for Pb(Zr,Ti)O$_3$ to crystallize, thereby polycrystallizing the Pb(Zr,Ti)O$_3$ film.

When a top electrode is formed on the Pb(Zr, Ti)O$_3$ film, there is obtained a ferroelectric capacitor of layered structure composed of SrRuO$_3$, Pb(Zr,Ti)O$_3$, and top electrode. Moreover, this process can be applied to a substrate of large diameter and hence is suitable for mass production.

According to another aspect of the present invention, there is provided an electronic device having a ferroelectric capacitor comprising: a base substrate having a main surface of SiO$_2$, an adhesion layer to promote adhesion between the main surface and its top layer, a Pt film formed on said adhesion layer, a bottom SrRuO$_3$ film formed on said Pt film, a Pb(Zr,Ti)O$_3$ film formed on said bottom SrRuO$_3$ film, and a top SrRuO$_3$ film formed on said Pb(Zr,Ti)O$_3$ film. The Pt film functions as a diffusion-preventing layer which blocks mutual reactions between SrRuO$_3$ and SiO$_2$.

According to a further aspect of the present invention, there is provided a process for producing an electronic device comprising the steps of; (a) forming a first perovskite-type conductive oxide film in an atmosphere of reduced pressure on an underlying surface at a first temperature, and (b) performing heat treatment on said first conductive oxide film in an oxidizing atmosphere containing oxygen at a second temperature which is higher than said first temperature.

Oxygen defects that might occur when the perovskite-type conductive oxide film is formed in an atmosphere of reduced pressure will be decreased by the subsequent heat treatment at a higher temperature in an oxidizing atmosphere containing oxygen.

According to another aspect of the present invention, there is provided a capacitor comprising a bottom electrode formed of an Ru-containing perovskite-type conductive oxide, a first dielectric film formed of a Pb-containing perovskite-type dielectric oxide having a stoichiometric composition on said bottom electrode, a second dielectric film formed of said perovskite-type dielectric oxide containing excess Pb on said dielectric film, and a top electrode formed of an Ru-containing perovskite-type conductive oxide.

The above-mentioned two-step process enables formation of a perovskite-type conductive oxide film of good quality and a perovskite-type dielectric oxide film of good characteristics. In the case where an SrRuO$_3$ film is formed without directly heating the substrate, mass-productivity of a layered structure can be enhanced In which the SrRuO$_3$ film is used as an electrode and a (Pb,La)(Zr,Ti)O$_3$ film is formed thereon.

DESCRIPTION OF THE PREFERRED EMBODIMENTS

Figure 1:
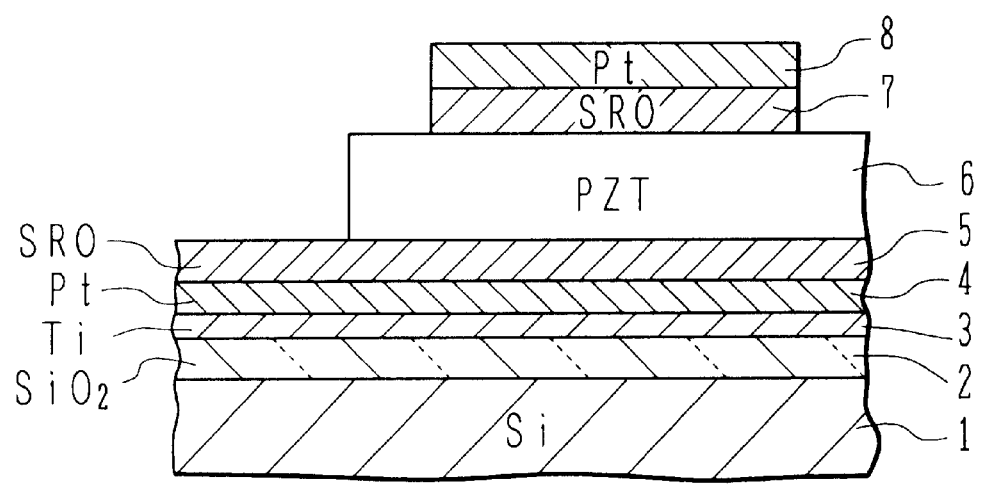
FIG. 1 is a sectional view showing a ferroelectric capacitor according to an embodiment of the present invention.

According to an embodiment of the present invention, a ferroelectric capacitor, as shown in section in FIG. 1, is produced by the process explained below.

A surface of a silicon substrate 1 is thermally oxidized to form an SiO$_2$ film 2. On this SiO$_2$ film 2 is formed a Ti film 3 (about 10–20 nm thick) by sputtering a Ti target in an Ar atmosphere. On this Ti film 3 is formed a bottom Pt film 4 (about 80–90 nm thick) by sputtering a Pt target in an Ar atmosphere. On this bottom Pt film 4 is formed a bottom SRO film 5 (5–100 nm thick, preferably about 80–90 nm thick) by RF magnetron sputtering.

This sputtering may be accomplished in a sputtering apparatus with a capacity of about 20 liters by using argon as the sputter gas and a sintered body of Sr$_{1.2}$RuO$_3$ (SRO) as the target, with the applied RF power adjusted to 120 W, the argon gas flow rate adjusted to 30 sccm, and the gas pressure adjusted to 10 mTorr.

The target SRO has a composition of Sr$_{1.2}$RuO$_3$. This is an Sr-rich composition rather than the stoichiometric composition Sr$_1$Ru$_1$O$_3$. The currently available sputtering technology hardly forms an SRO film having an exactly stoichiometric composition. Ru-rich SRO is subject to Ru diffusion, which deteriorates neighboring insulating film. By contrast, SRO of Sr-rich composition is less subject to Ru diffusion. However, what is important here is to prevent the formation of Ru-rich SRO film. Thus the resulting SRO film may have a stoichiometric composition. It would be possible to form intentionally an SRO film of stoichiometric composition by advanced technology in the future.

During sputtering to form a film, the substrate is not heated positively. However, presumably the substrate gets hot (about 100° C.) because it is exposed to plasma. The substrate may be kept at room temperature by positively cooling the substrate holder with water. Any other cooling means may also be used.

The SRO film thus formed, without directly heating the substrate, has amorphous phase. The amorphous SRO film is crystallized by heat treatment (such as lamp annealing) in an oxidizing atmosphere containing oxygen. This heat treatment may be carried out in an annealing apparatus having a capacity of about 20 liters, by supplying oxygen at a flow rate of about 5 L/min, with the temperature raised to 600° C. at a rate of 1° C./s, kept at 600° C. for 30 minutes, cooled to 200° C. over a period of 30 minutes, and finally cooled naturally.

This heat treatment polycrystallizes the amorphous SRO film. The above-mentioned heating condition may be changed such that, for example, the temperature is raised to 600° C. at a rate of 100° C./s and this temperature is kept for 2 minutes. The annealing temperature is not limited to 600° C.

Then, on the polycrystallized SRO film 5 is formed a PZT film 6 (about 300 nm thick) by sol-gel method. The first step of sol-gel method is to prepare an organometallic compound (sol-gel solution) containing Pb, Zr, and Ti in a molar ratio of 110:52:48. This is a Pb-rich composition rather than a stoichiometric composition of PZT. The Pb-rich PZT effectively prevents the formation of pyrochlore phase and effectively forms the perovskite of tetragonal phase.

This organometallic compound is applied onto the SRO film 5 by spin coating typically at 500 rpm for 3 seconds and then at 2000 rpm for 15 seconds. The spin coating is followed by the heating of the substrate at 470° C. for 5 minutes for thermal decomposition of the organometallic compound. The steps of spin coating and thermal decomposition are repeated six times. In this way there is obtained a PZT film which has a thickness of about 300 nm after crystallization.

The PZT film obtained by repeated spin coating and thermal decomposition is crystallized by heat treatment (such as lamp annealing) in an oxidizing atmosphere containing oxygen. This heat treatment may be carried out in an annealing apparatus having a capacity of about 20 liters, by supplying oxygen at a flow rate of about 5 L/min, with the temperature raised to 650° C. at a rate of 1° C./s, kept at 650° C. for 30 minutes, cooled to 200° C. over a period of 30 minutes, and finally cooled naturally.

In this way there is obtained a polycrystalline PZT film 6. The above-mentioned heating condition may be changed such that, for example, the temperature is raised to 650° C. at a rate of 100° C./s and this temperature is kept for 2 minutes.

On the polycrystallized PZT film 6 is formed a top SRO film (about 5–100 nm, preferably about 80–90 nm thick) and a top Pt film 8 (about 80–90 nm thick) by sputtering. This sputtering may be carried out under the same conditions as those for forming the bottom SRO film 2 and the bottom Pt film 4. Incidentally, this sputtering is carried out through a mask having through holes of 500 $\mu$m in diameter, so that the top SRO film 7 and the top Pt film 8 are formed only in limited circular regions of about 500 $\mu$m in diameter.

After the top Pt film 8 has been formed, the top SRO film 7 is crystallized by heat treatment under the same conditions as used to crystallize the bottom SRO film 5.

The top SRO film 7 and the top Pt film 8 and their surrounding are covered with a resist pattern. The PZT film 6 undergoes etching with hydrofluoric acid, so that the bottom SRO film 5 is partly exposed. In this way there is obtained a ferroelectric capacitor of SRO/PZT/SRO structure.

The above-mentioned embodiment is characterized in that the substrate is not heated positively when the SRO films 5 and 7 are formed by sputtering. The SRO films 5 and 7 are crystallized by the subsequent heat treatment.

In addition, the process in the above-mentioned embodiment is suitable for mass production employing large substrates in view of the fact that large substrates present difficulties in uniform heating in a sputtering apparatus under reduced pressure, whereas it is comparatively easy to uniformly heat substrates by lamp annealing or the like after film formation. Incidentally, lamp annealing may be replaced by heating in an electric furnace.

The Ti film 3 shown in FIG. 1 functions to improve adhesion between the $SiO_2$ film 2 and the bottom Pt film 4. Also, the bottom Pt film 4 functions as a diffusion barrier layer for preventing the mutual reaction (due to diffusion) between the bottom SRO film 5 and the $SiO_2$ film 2.

The PZT film 6 obtained as mentioned above was examined for crystallinity by X-ray diffractometry. There was obtained a pattern identical to that of powder. This indicates the random orientation of crystals. Also, the surface of the PZT film 6 was observed by an atomic force microscope. Rosette patterns of about 500 nm were partly found, microstructure mainly composed of large particles (about 200 nm) and small particles (about 50 nm). Presumably, the small particles are considered to be of pyrochlore phase.

Figure 2:
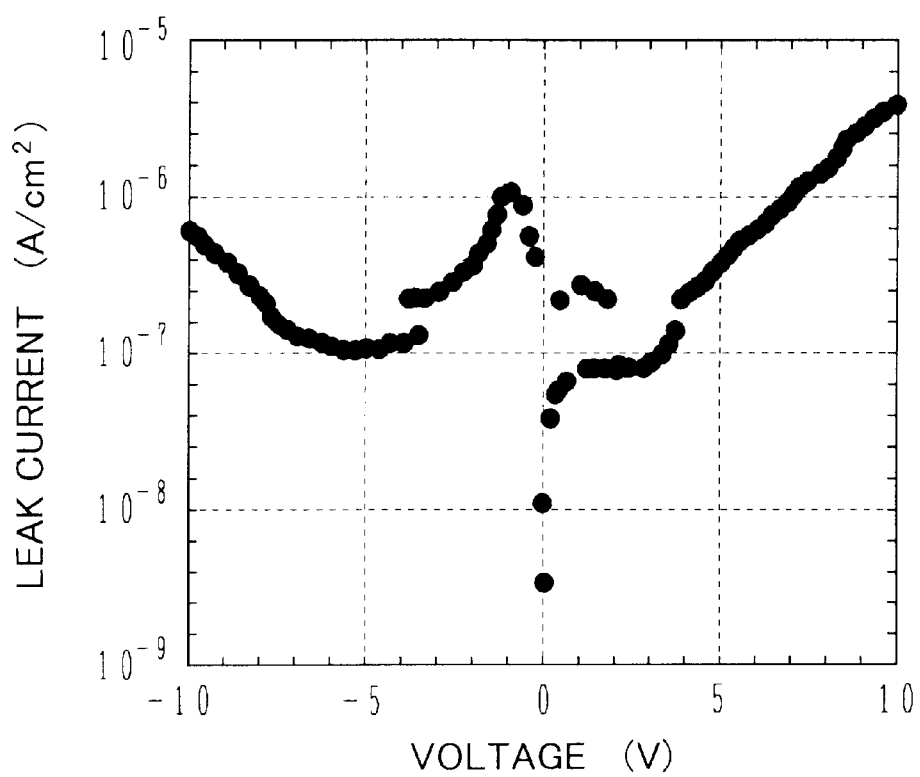
FIG. 2 is a graph showing the voltage dependence of the leak current of a ferroelectric capacitor according to an example of the embodiment of the present invention.

The capacitor shown in FIG. 1 has leak current which varies depending on voltage as shown in FIG. 2, with the ordinate representing leak current in $A/cm^2$ and the abscissa representing voltage in V. It is to be noted that leak current is lower than $10^{-6}$ $A/cm^2$ when 5 V is applied. Incidentally, leak current that appears at voltages from 0 to −4 V is due to the discharging of charge accumulated before voltage application.

In this capacitor, electric polarization of the PZT film becomes almost saturated as the applied voltage approaches 5 V. The result of test for polarization reversal ($Q_{SW}$–V characteristics) was that polarization becomes 90% saturated ($V_{90}$) at a comparatively low voltage of about 3.5 V.

Figure 3:
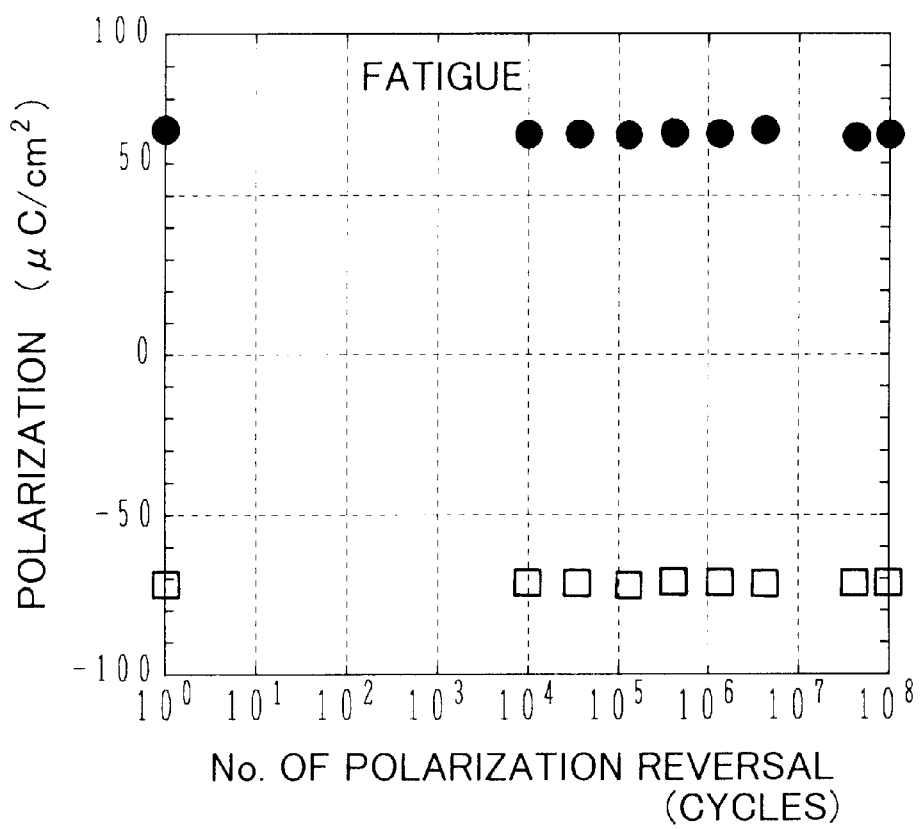
FIG. 3 is a graph showing the fatigue characteristics of a ferroelectric capacitor according to an example of the embodiment of the present invention.

The capacitor shown in FIG. 1 was tested for fatigue characteristics. The results are shown in FIG. 3. In this test, the capacitor was given a voltage of 5 V (peak value) and underwent polarization reversal at a cycle of 10 kHz. In FIG. 3, the abscissa represents the number of pulses applied and the ordinate represents electric polarization in $\mu C/cm^2$. (In one cycle of pulse, voltage changes from 0V to +5V or −5V and then returns to 0V.) In FIG. 3, electric polarization at +5V and −5V is indicated by black circles (●) and white squares (□), respectively.

It is noted from FIG. 3 that the magnitude of electric polarization decreases very little even after the repeated application of pulses as many times as $1 \times 10^8$. This result suggests that the capacitor would exhibit sufficient electric polarization even when the number of pulses applied reaches $1 \times 10^{12}$.

Figure 4:
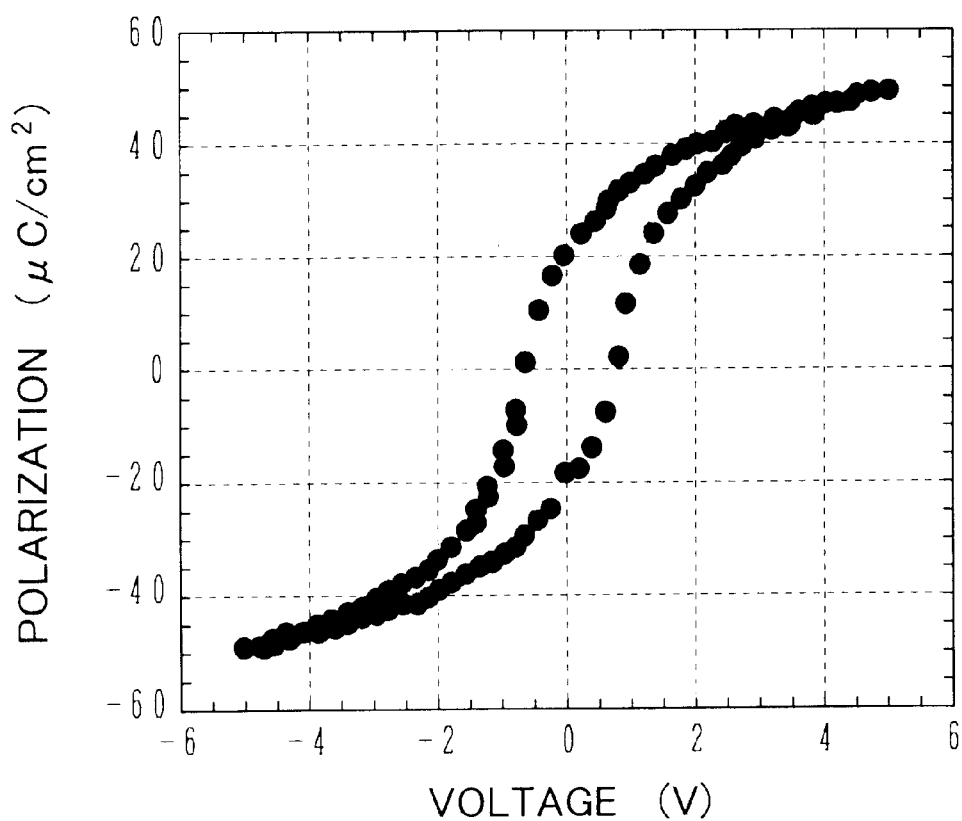
FIG. 4 is a graph showing the hysteresis characteristics (before and after fatigue test) of a ferroelectric capacitor according to an example of the embodiment of the present invention.

The PZT film of the capacitor gives the hysteresis characteristics as shown in FIG. 4, with the abscissa representing applied voltage in V and the ordinate representing electric polarization in $\mu C/cm^2$. This hysteresis loop was obtained before and after the fatigue test in which the sample underwent polarization reversal $1 \times 10^8$ times. It is noted that the values measured are almost identical before and after the fatigue test. In other words, no significant difference was found in the hysteresis before and after the fatigue test. The PZT film almost immune to fatigue due to polarization reversal is expected to find applications to the ferroelectric memory.

In the above-mentioned embodiment, PZT is crystallized by heat treatment at 650° C. This heat treatment is preferably be carried out at 500–1200° C. to ensure good crystallization and avoid vaporization of Pb. Heat treatment at 650° C. is desirably kept for about 2 minutes or longer, preferably for about 30 minutes. In the case of heat treatment at 1200° C., it is not necessary to hold this temperature but it is possible to lower the temperature immediately.

In the above-mentioned embodiment, PZT is heat-treated at 650° C., which is higher than 600° C. at which SRO is heat-treated. This implies that PZT and SRO undergo heat treatment simultaneously. An alternative embodiment would be possible in which PZT film is formed following the deposition of SRO film and they are heat-treated simultaneously in an oxidizing atmosphere containing oxygen.

In the above-mentioned embodiment, the temperature is raised at a rate of 1° C./s or 100° C./s to crystallize PZT. An excessively rapid temperature rise causes precipitation of secondary phases, leading to leak current. Therefore, the rate of temperature rise is preferably lower than 300° C./s, preferably lower than 100° C./s. The lower limit of the rate of temperature rise is determined from the standpoint of productivity. It is about (1/6)° C./s, for example.

In the above-mentioned embodiment, the application of the solution for PZT by sol-gel method is followed by thermal decomposition at 470° C. The thermal decomposition is preferably carried out at 200–500° C. If the temperature is too low, the resulting film lacks uniformity; and if the temperature is too high, crystallization of PZT occurs, which makes it difficult to control the preferred orientation. When duration of thermal decomposition exceeds 60 minutes, substantially no additional effect was observed by elongating the duration.

In the above-mentioned embodiment, the SRO film is formed first by sputtering without directly heating the substrate and then it is crystallized by heating the substrate in an oxidizing atmosphere.

If this heat treatment in an oxidizing atmosphere can sufficiently recover the oxygen defects, it is possible to positively heat the substrate at the time of sputtering.

In the above-mentioned embodiment also, it is considered that the substrate is heated to about 100° C. due to exposure to plasma. In the embodiment explained below, the substrate is heated during sputtering to form the SRO film.

The same steps as in the above-mentioned embodiment are repeated until the bottom Pt film 4 is formed. On the bottom Pt film 4 is formed a bottom SRO film 5 (5–100 nm thick) by high-temperature RF magnetron sputtering under the following conditions.

Sputtering gas: argon
Target: sintered body of SRO (with an Sr-rich composition)
RF power applied: 120 W
Argon flow rate: 30 sccm
Gas pressure: 10 mTorr
Substrate temperature: 600° C.

The SRO film thus formed, with the substrate heated, is crystalline, although its crystallinity is not sufficiently high. For further crystallization, the SRO film formed by high-temperature sputtering is subjected to heat treatment (by lamp annealing, for example) in an oxidizing atmosphere containing oxygen. As in the above-mentioned embodiment, this heat treatment is carried out in such a way that the temperature is raised to 650° C. at a rate of 100° C./s and this temperature is kept for 2 minutes. Heat treatment in this manner improves the crystallinity of the SRO film.

On the bottom SRO film 5 is formed a PZT film 6 (about 300 nm thick) by sol-gel method. The first step of sol-gel method is to prepare a Pb-rich organometallic compound containing Pb, Zr, and Ti in a molar ratio of 110:52:48. This organometallic compound is applied onto the bottom SRO film by spin coating typically at 500 rpm for 3 seconds and then at 2000 rpm for 15 seconds. The spin coating is followed by heat treatment (with the substrate heated at 470° C. for 5 minutes) for thermal decomposition of the organometallic compound. The steps of spin coating and thermal decomposition are repeated six times. In this way there is obtained a PZT film which will have a thickness of about 300 nm after crystallization.

The thus obtained PZT film is crystallized by heat treatment (such as lamp annealing) in an oxidizing atmosphere containing oxygen. This heat treatment may be carried out in such a way that the temperature is raised to 650° C. at a rate of 100° C./s and kept at this temperature for 2 minutes. In this way there is obtained a polycrystalline PZT film 6.

On the polycrystalline PZT film 6 is formed a top SRO film 7 (5–100 nm thick) and a top Pt film 8 (80–90 nm thick) by sputtering under the same conditions as for the bottom SRO film 2 and the bottom Pt film 4. This sputtering is carried out through a mask having through holes of 500 μm in diameter, so that the top SRO film 7 and the top Pt film 8 are formed only in limited circular regions of about 500 μm in diameter.

Subsequently, the top SRO film 7 is crystallized by heat treatment under the same conditions as those for the bottom SRO film 5.

The top SRO film 7 and the top Pt film 8 and their surrounding are covered with a resist pattern. The PZT film 6 undergoes etching with hydrofluoric acid, so that the bottom SRO film 5 is partly exposed. In this way there is obtained a ferroelectric capacitor of SRO/PZT/SRO layered structure.

In this embodiment, the SRO films 5 and 7 are formed by sputtering, with the substrate heated. The crystallinity of the SRO films 5 and 7 are improved by subsequent heat treatment. Incidentally, heat treatment by lamp annealing may be replaced by heating in an electric furnace.

The PZT film obtained in this embodiment was examined for crystallinity by X-ray diffractometry. The result indicates strong orientation in the (111) plane. Similar orientation in the (111) plane is found also in the PZT film formed on the SRO film which does not undergo heat treatment; however, the untreated SRO film is poor in crystallinity and the (111) plane gives weaker peaks than the heat-treated one.

The PZT film formed on the SRO film with or without heat treatment was tested for hysteresis loop. It was found that residual polarization is greater in the case of capacitor having a PZT film formed on the SRO film with heat treatment than in the case of capacitor having a PZT film formed on the SRO film without heat treatment. A probable reason for this is that the SRO film (as the base substrate) with improved crystallinity favorably improves the crystallinity of PZT.

The capacitor obtained in this embodiment was tested for fatigue characteristics and leak current characteristics. The results were satisfactory.

The good results in the above-mentioned embodiments are considered to be ascribed to the fact that the capacitor is composed of a dielectric film and two electrodes holding it between them which are all formed from a perovskite-type oxide. Similar good results, although somewhat inferior, are expected in the case where both of adjacent two layers are formed from perovskite-type oxides.

FeRAM is required to be superior in imprint characteristics as well as fatigue characteristics and leak current characteristics. However, PZT is not necessarily superior in imprint characteristics.

One of the ferroelectric materials which are expected to improve the imprint characteristics is lanthanum lead titanate zirconate $(Pb,La)(Zr,Ti)O_3$ (abbreviated as PLZT). Unfortunately, the ferroelectric capacitor of Pt/PLZT/Pt layered structure causes fatigue (decrease in residual polarization) when the number of repeatedly applied pulses amounts to about $10^6$ times. This is detrimental to reliability.

Figure 5:
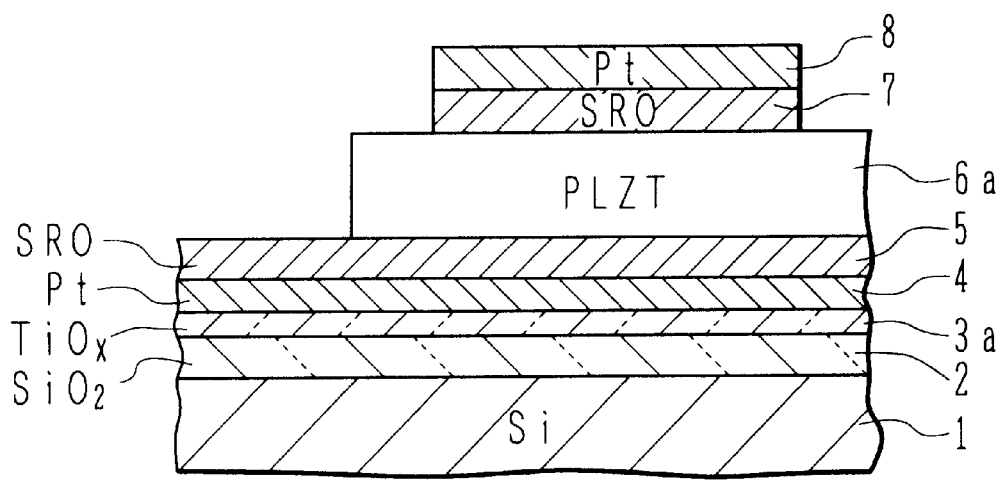
FIG. 5 is a sectional view showing a ferroelectric capacitor according to another embodiment of the present invention.

FIG. 5 is a sectional view showing a PLZT ferroelectric capacitor according to another embodiment of the present invention. The substrate 1 is formed of, for example, p-type silicon. On its surface is formed a semiconductor device such as MOS transistor.

The insulating film 2 is formed of a field oxide film, an interlayer insulating film, or the like, made of $SiO_2$. On the insulating film 2 is formed a $TiO_x$ film which functions as an adhesion film 3a. On the adhesion film 3a are formed a bottom Pt film 4 and a bottom SRO film 5.

The adhesion layer 3a firmly bonds together the insulating film 2 and the bottom Pr film 4. The bottom Pt film 4 functions as a barrier layer to prevent chemical reactions between the SRO film 5 and the insulating film 2. Having a low resistance, the bottom Pt film 4 also functions to reduce the resistance of the bottom electrode. Incidentally, reactions between SRO and $SiO_2$ give rise to strontium silicate which adversely affects the insulation characteristic of the insulating film.

On the bottom SRO film 5 is formed a PLZT film 6a, on which are further formed a top SRO film 7 and a top Pt film 8. In this way there is obtained a ferroelectric capacitor of SRO/PLZT/SRO layered structure.

A process for making this PLZT ferroelectric capacitor will be explained below.

On the Si substrate 1 is formed a field oxide film 2 having a thickness of hundreds of nm. Then, a MOS transistor, interlayer insulating film, and wiring are formed according to necessity. For simplicity, it is assumed here that only a field oxide film is formed. On the $SiO_2$ film 2 is formed a $TiO_x$ film 3a having a thickness of 10–20 nm by reactive sputtering. On this film is formed a bottom Pt film 4 having a thickness of about 100 nm by sputtering. On this film is formed an SRO film 5 having a thickness of about 100 nm by sputtering.

This sputtering is performed on the substrate which is not positively heated but is allowed to stand at room temperature. The SRO film 5 formed in this manner is in an amorphous phase. This amorphous SRO film 5 is crystallized by lamp annealing, with the temperature raised to 600° C. at a rate of 1° C./s and held at 600° C. for 30 minutes. This heat treatment turns the amorphous SRO film 5 into a crystalline SRO film. Thereafter, the substrate is cooled.

On the SRO film 5 is formed a PLZT film 6a by application of an organometallic sol-gel solution of PLZT. This sol-gel solution of PLZT is either one containing excess Pb(+La) or one having a stoichiometric composition. The former contains Pb, La, Zr, and Ti in a molar ratio of 110.5:1.5:45:55. The PLZT films 6a were formed in the following four different ways, and their results were reviewed.

(1) Conventional sol-gel method is employed. The PLZT film of desired thickness is formed by repeating several times the steps of spin-coating an SRO film 5 with a Pb-rich PLZT sol-gel solution, drying the coated film, and thermally decomposing the dried film. Then, the total PLZT film is collectively crystallized by annealing.

(2) The PLZT film 6a of desired thickness is formed by repeating several times the steps of spin-coating a Pb-rich PLZT sol-gel solution, drying the coated film, thermally decomposing the dried film, and performing lamp annealing for crystallizing the PLZT film, before forming the next PLZT layer.

(3) The first PLZT layer is formed by spin coating a PLZT sol-gel solution having a stoichiometric composition, drying the coated film, and thermally decomposing the dried film. The second and subsequent layers are formed by repeating several times the steps of spin coating a Pb-rich PLZT sol-gel solution, drying the coated film, and thermally decomposing the dried film. The total PLZT film of desired thickness is collectively crystallized by annealing.

(4) The first PLZT layer is formed by spin coating a PLZT sol-gel solution having a stoichiometric composition, drying the coated film, and thermally decomposing the dried film. The thus formed PLZT layer is crystallized by lamp annealing. Each of the second and subsequent layers is formed by the steps of spin coating a Pb-rich PLZT sol-gel solution, drying the coated film, and thermally decomposing the dried film. Each layer is respectively crystallized by annealing.

On the PLZT film formed by each of the above-mentioned four methods is formed a top SRO film 7. On this film is formed a top Pt film 8. The top SRO film 7 and the top Pt film 8 are formed in the same manner as for the bottom SRO film and the bottom Pt film. However, since the SRO film 7 and the Pt film 8 are deposited in the reverse order, the annealing to crystallize the SRO film 7 is carried out after the SRO film 7 and the Pt film 8 are formed. In this way there is obtained the ferroelectric capacitor of SRO/PLZT/SRO layered structure.

The PLZT ferroelectric capacitor formed on the Si wafer by the above-mentioned method was examined for crystallinity by X-ray diffractometry. All the samples of PLZT film formed on the SRO film gave a random pattern almost identical to that of powder, which suggests the random orientation of crystals. The samples were also observed under a scanning electron microscope (SEM). It was found that the PLZT film formed by crystallizing all the layers at one time is composed of particles of about 200 nm in size. It was also found that the PLZT film formed by crystallizing the layers individually is composed of particles of about 150 nm in size.

Figure 6:
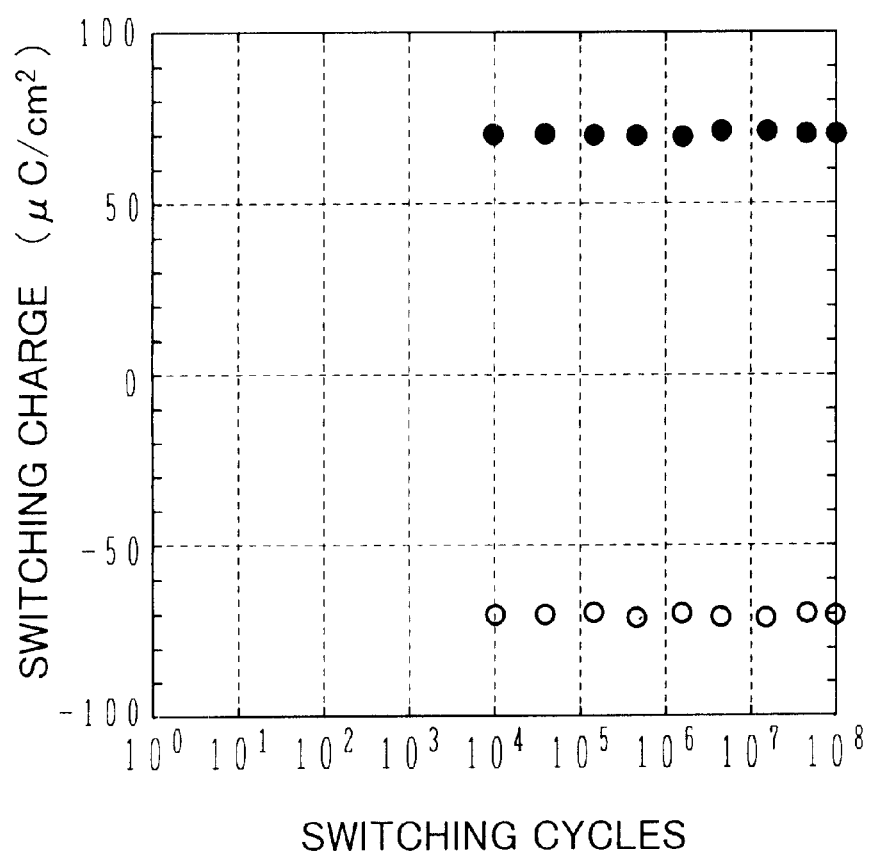
FIG. 6 is a graph showing the fatigue characteristics of a ferroelectric capacitor according to an example of the embodiment (shown in FIG. 5) of the present invention.

The capacitor shown in FIG. 5 was tested for fatigue characteristics. The results are shown in FIG. 6. In this test, the capacitor was given a voltage of 5 V (peak value) and underwent polarization reversal at a cycle of 10 kHz. In FIG. 6, the abscissa represents the number of pulses applied and the ordinate represents electric polarization in $\mu C/cm^2$. In one cycle of pulse, voltage changes from 0V to +5V or −5V and then returns to 0V. In FIG. 6, electric polarization at +5V and −5V is indicated by black circles (●) and white circles (○), respectively.

It is noted from FIG. 6 that the magnitude of electric polarization decreases very little even after the repeated applications of pulses as many times as $1 \times 10^8$. This result suggests that the capacitor would exhibit sufficient electric polarization even when the number of pulses applied reaches $1 \times 10^{12}$. No change was observed in hysteresis before and after the fatigue test.

Figure 7:
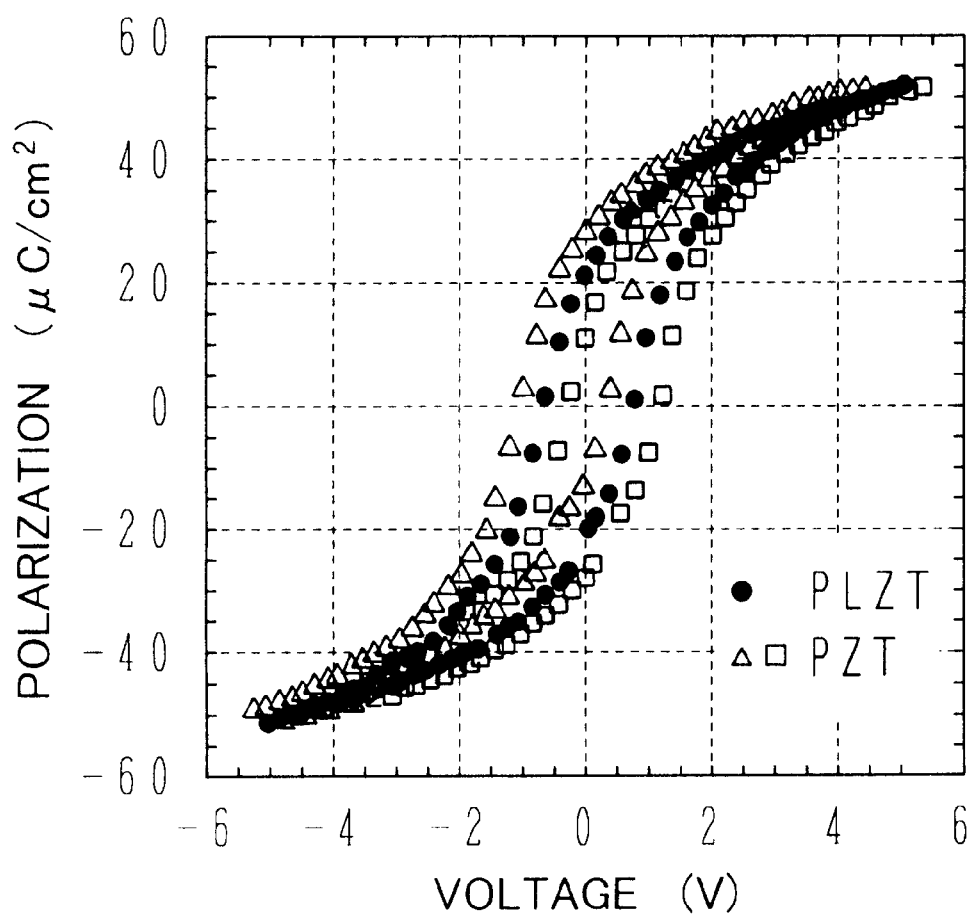
FIG. 7 is a graph showing the hysteresis characteristics (after imprint test) of a ferroelectric capacitor according to an example of the embodiment (shown in FIG. 5) of the present invention.

The capacitor shown in FIG. 5 is tested for imprint characteristics. For reference, capacitors with PZT film, in place of PLZT film, were also tested for imprint characteristics. The results are shown in FIG. 7. In this imprint test, the sample was given a positive or negative voltage and kept at 150° C. for 20 hours in polarized state. The sample was measured for hysteresis before and after the imprint test.

In FIG. 7, the abscissa represents the voltage (in V) applied for hysteresis measurement, and the ordinate represents the polarization in $\mu C/cm^2$. Black circles (●) in FIG. 7 represent values for the capacitor having the PLZT film. It is noted that the results are almost the same and the plots are overlapping regardless of the polarity (positive or negative) of voltage applied.

White triangles (Δ) in FIG. 7 represent values for the capacitor having the PZT film. This hysteresis was observed after the imprint test, with a negative voltage applied. White squares (□) in FIG. 7 represent values for the capacitor having the PZT film. This hysteresis was observed after the imprint test, with a positive voltage applied.

It is noted from FIG. 7 that the capacitor having the PZT film is apparently affected by the imprint test, whereas the capacitor having the PLZT film is affected very little by the imprint test. The samples of PLZT capacitor prepared in the four different methods exhibited the same imprint characteristics in common.

The PLZT capacitors prepared as mentioned above were tested for leak current. Leak current is a current which flows across the electrodes of the capacitor when a voltage of +5V or −5V is applied. The results are shown in Table 1 below.

TABLE 1

| Sample | +5 V/−5 V (A cm$^{-2}$) |
| --- | --- |
| 1 | $8.2 \times 10^{-7}/2.6 \times 10^{-6}$ |
| 2 | $6.5 \times 10^{-7}/9.5 \times 10^{-7}$ |
| 3 | $5.8 \times 10^{-7}/6.2 \times 10^{-7}$ |
| 4 | $3.2 \times 10^{-7}/4.5 \times 10^{-7}$ |

In the following, the sum of leak currents for both polarities is regarded as the leak current of each sample. It is apparent from Table 1 that the leak current decreases as the sample number increases. The leak current is smaller in the case where heat treatment for crystallization are performed individually after thermally decomposing each PLZT layer than in the case where heat treatment for crystallization is collectively performed on all PLZT layers at one time. Also, the leak current is smaller in the case where the first PLZT layer is formed from the sol-gel PLZT solution having a stoichiometric composition than in the case where all the PLZT layers are formed from the sol-gel PLZT solution having a Pb-rich non-stoichiometric composition. Also, forming the first layer from the sol-gel PLZT solution having a stoichiometric composition produces a more pronounced effect than heat treatment.

The samples were observed under a transmission electron microscope (TEM). It was found that the PLZT film in which the first layer was formed from the solution having a stoichiometric composition showed clear interface between PZT film and bottom electrode. A probable reason for this is considered to be that Pb is not diffused into the bottom electrode.

In the case where all the layers constituting the PLZT film are formed from the same solution of Pb-rich composition, there is no distinct interface between the PLZT film and the bottom electrode and a secondary phase is generated around the interface. The secondary phase is considered to have a thickness of about 10–20 nm.

These results suggest that the secondary phase formed at the interface is responsible for increase in leak current. Moreover, in the case where a plurality of PLZT layers are laminated and each layer undergoes heat treatment for crystallization at each time it is formed, the resulting PLZT film has a finer structure which is considered to decrease the leak current.

Incidentally, if all the layers for the PLZT film are formed from the sol-gel solution having a stoichiometric composition, Pb tends to escape from the film. When Pb composition decreases, polarization characteristics and fatigue characteristics will be degraded.

The temperature of the annealing heat treatment to crystallize PLZT is analyzed. Heat treatment at a temperature lower than 500° C. does not crystallize PLZT or crystallize PLZT with very poor crystallinity. Heat treatment at a temperature higher than 1200° C. causes Pb to vaporize vigorously and hence the resulting PLZT film loses its stoichiometric composition.

The time period of keeping or holding a high temperature after raising the temperature in the annealing for crystallization is analyzed. In the case of a low temperature of about 500° C., a hold time of about 300 minutes was necessary for obtaining a PLZT film of good crystallinity. In contrast, it is not necessary to hold the high temperature, but only elevating the temperature was sufficient if the temperature is as high as about 1200° C.

Amount of excess Pb is analyzed. If the amount of excess Pb is less than 0.1 mol %, the resulting sample could produce the pyrochlore phase with Pb defects, which aggravates the ferroelectric characteristics. If the amount of excess Pb is 25 mol %, the resulting sample could produce PbO precipitates as the secondary phase. The amount of excess Pb is preferably selected in a range of 0.1–30 mol %.

With a sol-gel solution having a concentration lower than 0.1 wt %, it was difficult to obtain a desired film thickness. With a sol-gel solution having a concentration of 25 wt %, it was difficult to obtain a fine and uniform surface structure. It would be preferable to select the concentration of the solution in a range of 0.1–40 wt %.

Although the above-mentioned results were obtained in the case where PLZT is used as the ferroelectric film, it is expected that similar results will be obtained also in the case where PZT is used.

Although description has been made on the case where SRO is used as the perovskite-type conductive oxide, it would be possible to use other perovskite-type conductive oxides, in place of SRO, such as $BaRuO_3$, $Sr_{1-x}RE_xCoO_3$, and $Sr_{1-x}RE_xTiO_3$ (where RE is at least one species selected from La, Sm, and Nd).

Although description has been made on the case where PZT or PLZT is used as the perovskite-type ferroelectric oxide, it would be possible to use other perovskite-type insulating oxides. As ferroelectric material, Sr—Bi—Ta containing oxides such as $SrBi_2Ta_2O_8$ ($Y_1$), and Sr—Bi—Ti containing oxides may be used. As high dielectrics for DRAM, $Ba_xSr_{1-x}TiO_3$ (BSTO) and $SrTiO_3$ (STO) may be used.

The metal electrode to be combined with the perovskite-type conductive oxide is not limited to Pt. It would be possible to use metal such as Ru and Ir, conductive metal oxide such as $IrO_2$, conductive metal nitride such as TiN, and conductive metal silicide such as WSi and TiSi.

Although description has been made on the case where the film of perovskite-type conductive oxide is formed by RF magnetron sputtering, it may be formed by DC sputtering.

Figure 8:
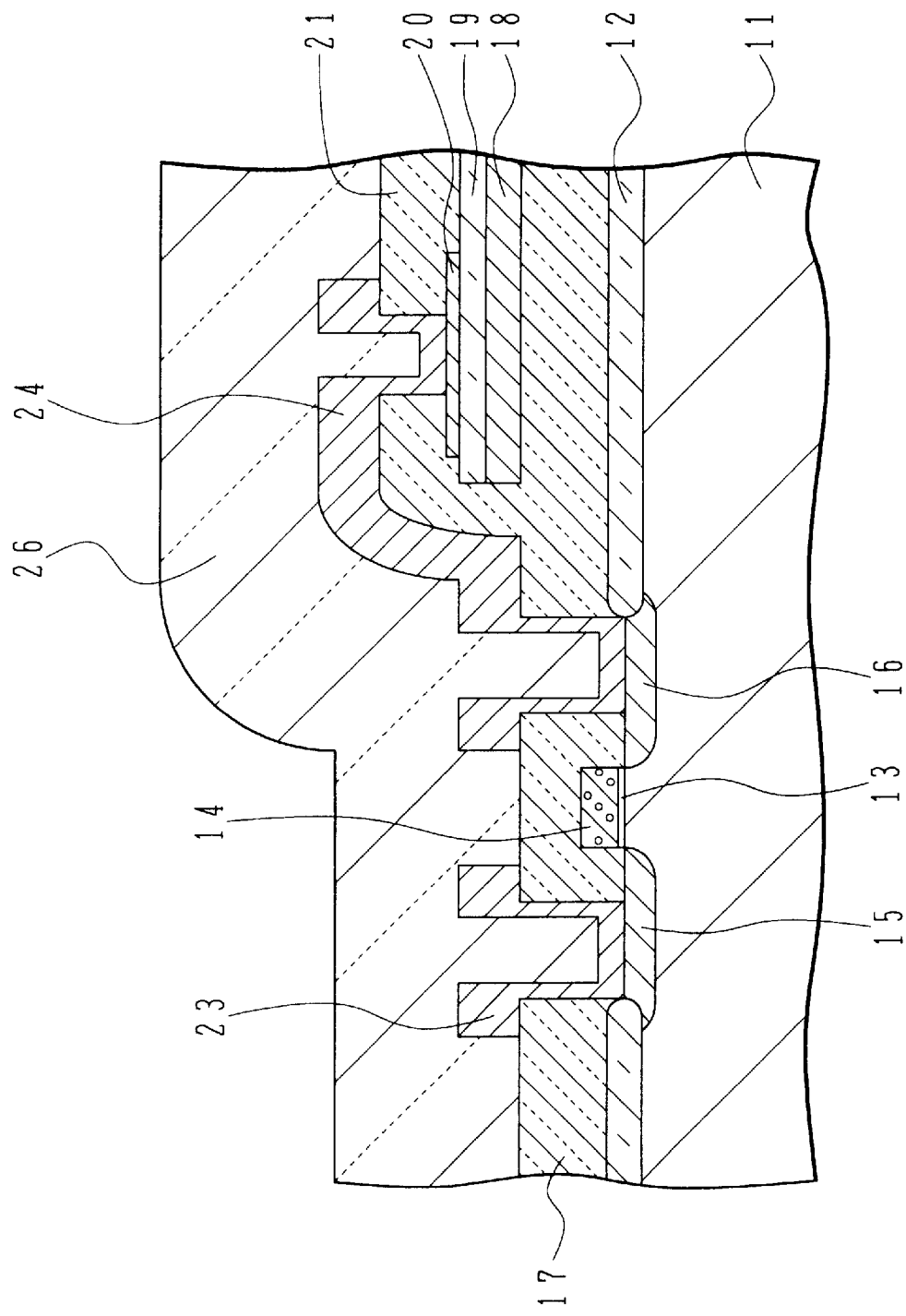
FIG. 8 is a sectional view showing a ferroelectric memory cell.
Figure 9:
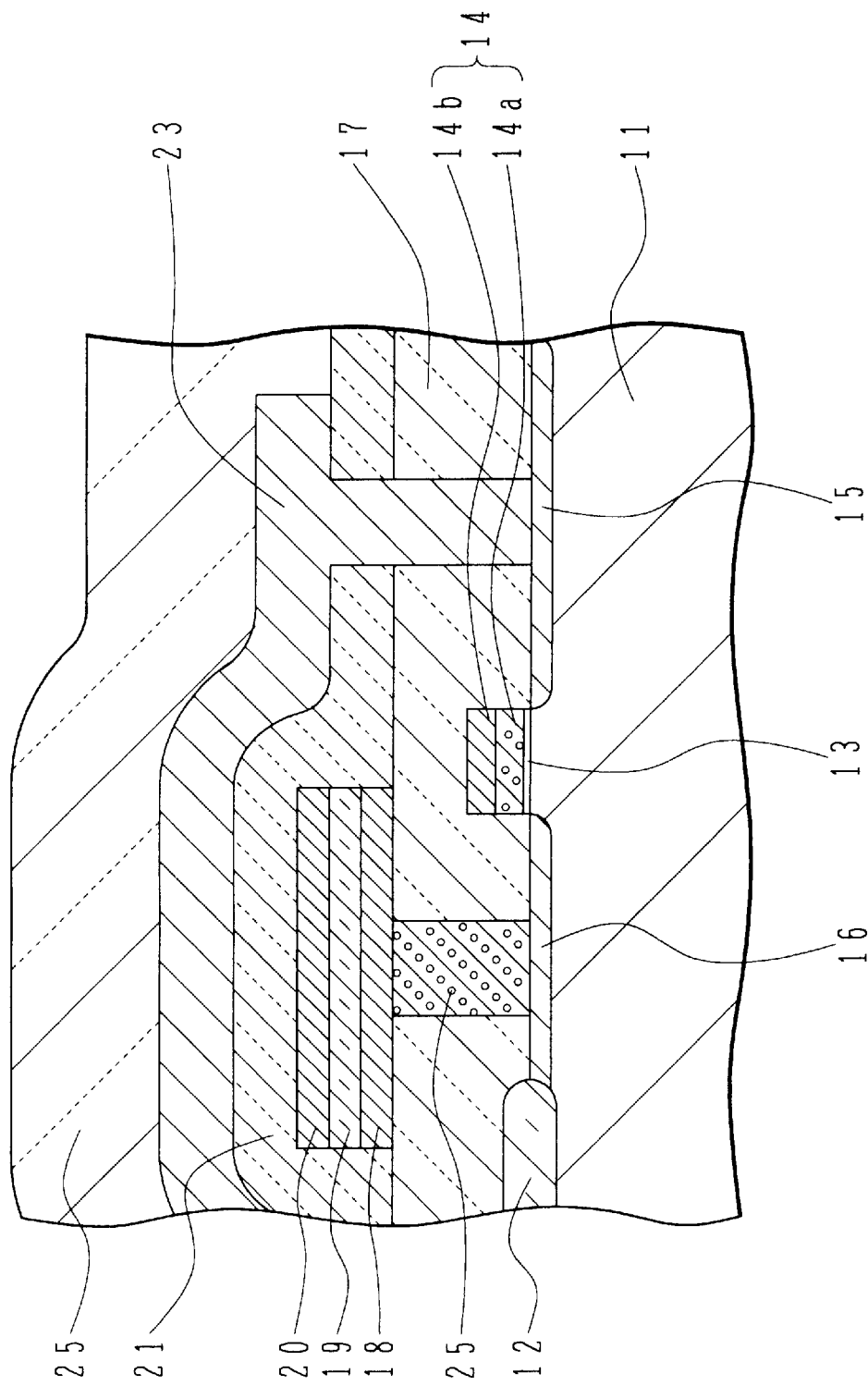
FIG. 9 is a sectional view showing a ferroelectric memory cell.

FIGS. 8 and 9 schematically show structures of a ferroelectric memory cell employing the above-mentioned ferroelectric capacitor. Referring to FIG. 8, a field oxide film 12 is formed selectively on the surface of the substrate 11, to define an active region. In the active region, an insulated gate electrode is formed by laminating a gate oxide film 13 and a gate electrode 14. On both sides of the gate electrode are formed a source region 15 and a drain region 16 by ion implantation. In this way a MOS transistor is formed.

This MOS transistor is covered with an interlayer insulating film 17. On this layer 17 is formed a ferroelectric capacitor by laminating a bottom electrode 18, a ferroelectric layer 19, and a top electrode 20. This ferroelectric capacitor is covered with another interlayer insulating film 21. A connection hole is formed through the interlayer insulating films 21 and 17. This connection hole is filled with, for example, aluminum, to form electrodes 23 and 24.

The electrodes 23 and 24 are covered with a passivation film 26 which is a silicon nitride film formed by plasma-enhanced CVD. The ferroelectric capacitor composed of layers 18, 19, and 20 may be produced by the same manner as used in the above-mentioned embodiments.

In the structure shown in FIG. 8, the MOS transistor is connected to the top electrode of the ferroelectric capacitor. Alternatively, the MOS transistor may be connected to the bottom electrode of the ferroelectric capacitor.

FIG. 9 shows a structure wherein the MOS transistor is connected to the bottom electrode of the ferroelectric capacitor. The construction in this embodiment is similar to that shown in FIG. 8 in that a field oxide film 12, a gate oxide film 13, an insulated gate electrode 14, a source region 15, and a drain region 16 are formed in and on the surface of the p-type Si substrate 11. The gate electrode 14 is formed of a polycrystalline silicon layer 14*a* and a silicide layer 15*b* laminated on the layer 14*a*. The MOS transistor is covered with an interlayer insulating film 17. A connection hole is formed through the interlayer insulating film 17 and reaches the drain region 16. This connection hole is filled with polycrystalline silicon to form a connecting plug 25. On the plug 25 and the interlayer insulating film 17 is formed a ferroelectric capacitor consisting of a bottom electrode 18, a ferroelectric layer 19, and a top electrode 20.

The ferroelectric capacitor is covered with another interlayer insulating film 21. A connection hole is formed through the interlayer insulating films 21 and 17. The connection hole is filled with a wiring 23. This wiring 23 is covered with a passivation film 25. The plug may also be formed of W and the like in place of polycrystalline silicon. The wiring may be formed of Al, W, Cu, and the like.

Figure 10:
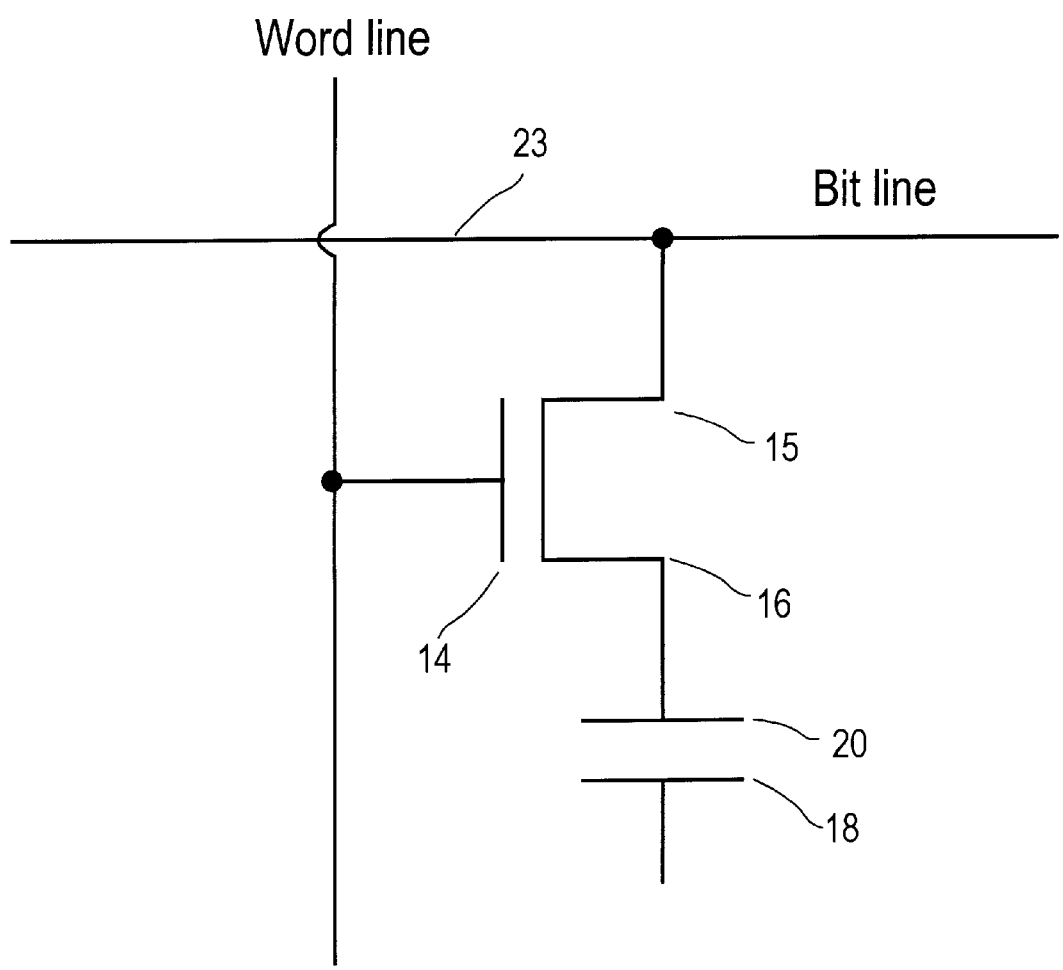
FIG. 10 is an equivalent circuit of the ferroelectric memory employing the structure as shown in FIGS. 8 and 9.

FIG. 10 shows an equivalent circuit of a ferroelectric memory device, in which a ferroelectric memory cell as shown in FIG. 8 or 9 can be employed.

A transfer transistor comprises a source region 15 connected to a bit line, a gate electrode 14 connected to a word line, and a drain region 16 connected to a ferroelectric capacitor. The figure shows the case where the top electrode 20 of the ferroelectric capacitor is connected to the drain region 16, and the bottom electrode 18 is connected to a reference voltage (e.g. ground potential), as in the case of FIG. 8. In the case of FIG. 9, the connection of the top electrode 20 and the bottom electrode 18 are interchanged.

Incidentally, the structure of FeRAM is not limited to those shown in FIGS. 8 and 9. It is possible to make an FeRAM that employs a ferroelectric capacitor or a DRAM that employs a high dielectric layer. There will be a wide range of applications in addition to semiconductor devices. An example of such applications is the ink jet printer head. In this case, it can be expected that the characteristics will not deteriorate even after use for a long period of time.

Although the foregoing description has been made on the preferred embodiments, the invention is not limited thereto.

It will be apparent to those skilled in the art that various changes, modifications, combinations, etc. can be made.

What we claim are:

1. A method for manufacturing an electronic device comprising the steps of:
   (a) forming on a underlying base a first conductive oxide film of perovskite type of an amorphous phase or a crystalline phase in an atmosphere of reduced pressure at a first temperature,
   (b) performing heat treatment on said first conductive oxide film in an oxidizing atmosphere containing oxygen at a second temperature which is higher than said first temperature to crystallize said first conductive oxide film of amorphous phase or increase the crystallinity of said first conductive oxide film of crystalline phase, and then
   (x) forming an oxide dielectric film of perovskite type on said first conductive oxide film.

2. A method for manufacturing an electronic device as defined in claim 1, wherein said conductive oxide film is formed of $SrRuO_3$ (SRO) having a stoichiometric composition or an Sr-rich composition.

3. A method for manufacturing an electronic device as defined in claim 1, wherein said step (x) includes the steps of (c) forming, after said step (b), on said first conductive oxide film, said oxide dielectric film of perovskite type, and (d) performing heat treatment on said oxide dielectric film and said first conductive oxide film in an oxidizing atmosphere containing oxygen at a third temperature.

4. A method for manufacturing an electronic device as defined in claim 3, wherein said process (c) forms a film by sol-gel method comprising the steps of applying an organometallic sol-gel solution and thermally decomposing said organometallic compound, and said step (d) crystallizes said oxide dielectric film.

5. A method for manufacturing an electronic device as defined in claim 4, wherein said step (x) includes the step of repeating said step (c) and said step (d).

6. A method for manufacturing an electronic device as defined in claim 3, wherein said oxide dielectric film is formed of $(Pb,La)(Zr,Ti)O_3$ (PLZT) and said third temperature is in a range from 500° C. to 1200° C.

7. A method for manufacturing an electronic device as defined in claim 6, wherein said PLZT contains excess Pb in an amount of 0.1–30 mol %.

8. A method for manufacturing an electronic device as defined in claim 1, wherein said step (x) includes, after said step (a) and before said step (b), the step of forming said oxide dielectric film of perovskite type on said first conductive oxide film, and said step (b) performs heat treatment on said first conductive oxide film and said oxide dielectric film.

9. A method for manufacturing an electronic device as defined in claim 1, wherein said oxide dielectric film is formed of $(Pb,La)(Zr,Ti)O_3$ (PLZT) and said second temperature is in a range from 500° C. to 1200° C.

10. A method for manufacturing an electronic device as defined in claim 9, wherein said PLZT contains excess Pb in an amount of 0.1–30 mol %.

11. A method for manufacturing an electronic device as defined in claim 1, wherein said first conductive oxide film has a composition containing Ru and said oxide dielectric film has a composition containing Pb, and said step (x) includes substeps of (x-1) forming on said first conductive oxide film an initial layer of oxide dielectric from a material having a stoichiometric composition, and (x-2) forming on said initial layer a main layer of oxide dielectric from a material having a Pb-rich non-stoichiometic composition.

12. A method for manufacturing an electronic device as defined in claim 11, wherein said substeps (x-1) and (x-2) each include the steps of applying an organometallic sol-gel solution, thermally decomposing said organometallic compound, and performing heat treatment on a subsequently formed oxide dielectric film at a temperature higher than its crystallizing temperature.

13. A method for manufacturing an electronic device as defined in claim 11, wherein said oxide dielectric is $(Pb,La)(Zr,Ti)O_3$ and said non-stoichiometric composition contains excess Pb.

14. A method for manufacturing an electronic device as defined in claim 13, wherein the amount of excess Pb is 0.1–30 mol %.

15. A method for manufacturing an electronic device as defined in claim 12, wherein said sol-gel solution has a concentration of 0.1 wt %–40 wt %.

16. A method for manufacturing an electronic device as defined in claim 1, further comprising the steps of (e) forming, on said oxide dielectric film, a second conductive oxide film of perovskite type in an atmosphere of reduced pressure at a fourth temperature, and (f) performing heat treatment on said second conductive oxide film in an oxidizing atmosphere containing oxygen at a fifth temperature which is higher than said fourth temperature.

17. A method for manufacturing an electronic device as defined in claim 16, wherein said step (e) forms said second conductive oxide film of amorphous phase and said step (f) crystallize said second conductive oxide film of amorphous phase.

18. A method for manufacturing an electronic device as defined in claim 16, wherein said step (e) forms said second conductive oxide film of crystalline phase and said step (f) increases the crystallinity of said second conductive oxide film.

19. A method for manufacturing an electronic device as defined in claim 16, further comprising a step of (g) forming on said second conductive oxide film a conductive film formed of at least one species selected from the group consisting of metal, conductive metal oxide, conductive metal nitride, and conductive metal silicide.

20. A method for manufacturing an electronic device as defined in claim 19, wherein said step (g) is carried out between said step (e) and said step (f).

21. A method for manufacturing an electronic device as defined in claim 1, wherein said underlying base is a semiconductor substrate having semiconductor elements formed thereon which is covered with an insulating film.

22. A method for manufacturing an electronic device comprising the steps of:
   (a) forming on an oxide dielectric film of perovskite type a first conductive oxide film of perovskite type in an atmosphere of reduced pressure at a first temperature, and
   (b) performing heat treatment on said conductive oxide film in an oxidizing atmosphere containing oxygen at a second temperature which is higher than said first temperature.

23. A method for manufacturing an electronic device as defined in claim 22, wherein said step (a) forms said conductive oxide film of amorphous phase and said step (b) crystallizes said conductive oxide film of amorphous phase.

24. A method for manufacturing an electronic device as defined in claim 22, wherein said step (a) forms said conductive oxide film of crystalline phase and said step (b) increases the crystallinity of said conductive oxide film.

25. A method for manufacturing an electronic device as defined in claim 22, further comprising the step of (c) forming on said second conductive oxide film a conductive film formed of at least one species selected from the group consisting of metal, conductive metal oxide, conductive metal nitride, and conductive metal silicide.

26. A method for manufacturing an electronic device as defined in claim 25, wherein said step (c) is carried out between said step (a) and said step (b).

27. A method for manufacturing a layered structure including a PZT thin film, said process comprising the steps of:
   forming on a main surface of an underlying base an amorphous $SrRuO_3$ film by sputtering without directly heating the substrate;
   performing heat treatment on said amorphous $SrRuO_3$ film at a temperature high enough for $SrRuO_3$ to crystallize, thereby polycrystallizing said amorphous $SrRuO_3$ film;
   forming on said polycrystallized $SrRuO_3$ film a $Pb(Zr,Ti)O_3$ film by sol-gel method; and
   performing heat treatment on said $Pb(Zr,Ti)O_3$ film at a temperature high enough for $Pb(Zr,Ti)O_3$ to crystallize, thereby polycrystallizing said $Pb(Zr,Ti)O_3$ film.

28. A method for manufacturing a layered structure including a PZT thin film as defined in claim 27, further comprising the steps of:
   forming on said $Pb(Zr,Ti)O_3$ film another amorphous $SrRuO_3$ film by sputtering without directly heating the substrate; and
   performing heat treatment on said another $SrRuO_3$ film at a temperature high enough for $SrRuO_3$ to crystallize, thereby polycrystallizing said another $SrRuO_3$ film.

29. A method for manufacturing a layered structure including a PZT thin film as defined in claim 28, wherein heat treatment is carried out in an oxygen-containing atmosphere in the step of polycrystallizing said $Pb(Zr,Ti)O_3$ film and in the step of polycrystallizing said another $SrRuO_3$ film.

30. A method for manufacturing an electronic device including a PLZT film, said process comprising the steps of:
   (a) forming on the main surface of a base substrate an amorphous $SrRuO_3$ film by sputtering without directly heating the substrate;
   (b) performing heat treatment on said amorphous $SrRuO_3$ film at a temperature high enough for $SrRuO_3$ to crystallize, thereby polycrystallizing said $SrRuO_3$ film; and
   (x) forming on said polycrystallized $SrRuO_3$ film a $(Pb, La)(Zr,Ti)O_3$ film by sol-gel method.

31. A method for manufacturing an electronic device including a PLZT film as defined in claim 30, wherein said step (x) repeats several times substeps of applying the sol-gel solution, thermally decomposing the sol-gel solution, and performing annealing for crystallization after each thermal decomposition, utilizing a solution of same composition.

32. A method for manufacturing an electronic device including a PLZT film as defined in claim 31, wherein said step (x) employs a 0.1 wt %–40 wt % sol-gel solution containing excess lead in an amount of 0.1 mol %–30 mol %.

33. A method for manufacturing an electronic device including a PLZT film as defined in claim 31, wherein said annealing for crystallization is carried out at a heating temperature of 500–1200° C. for a holding time of 0 minute–300 minutes.

34. A method for manufacturing an electronic device including a PLZT film as defined in claim 30, wherein said step (x) includes the substeps of
   coating and thermally decomposing an initial layer from a sol-gel solution having a stoichiometric composition and a subsequent layer from a sol-gel solution containing excess lead, and
   performing annealing for crystallization after completion of coating and thermal decomposition for all layers.

35. A method for manufacturing an electronic device including a PLZT film as defined in claim 34, wherein said initial layer is formed from a 0.1 wt %–40 wt % sol-gel solution having a stoichiometric composition.

36. A method for manufacturing an electronic device including a PLZT film as defined in claim 34, wherein said lead-rich layer is formed from a 0.1 wt %–40 wt % sol-gel solution containing excess lead in an amount of 0.1 mol %–30 mol %.

37. A method for manufacturing an electronic device including a PLZT film as defined in claim 34, wherein said annealing for crystallization is carried out at a heating temperature of 500° C.–1200° C. for a holding time of 0 minute–300 minutes.

38. A method for manufacturing an electronic device including a PLZT film as defined in claim 34, wherein said initial layer has a thickness in a range of 1 nm–100 nm after crystallization thereof.

39. A method for manufacturing an electronic device including a PLZT film as defined in claim 30, wherein said step (x) includes the substeps of: forming an initial layer from a sol-gel solution having a stoichiometric composition by coating, thermal decomposition, and crystallization; and forming subsequent lead-rich layers, each by coating, thermal decomposition, and annealing for crystallization.

40. A method for manufacturing an electronic device including a PLZT film as defined in claim 39, wherein said initial layer is formed of a 0.1 wt %–40 wt % sol-gel solution having a stoichiometric composition.

41. A method for manufacturing an electronic device including a PLZT film as defined in claim 39, wherein said lead-rich layer is formed of a 0.1 wt %–40 wt % sol-gel solution containing excess lead in an amount of 0.1 mol %–30 mol %.

42. A method for manufacturing an electronic device including a PLZT film as defined in claim 39, wherein said annealing for crystallization is carried out at a heating temperature of 500° C.–1200° C. for a holding time of 0 minute–300 minutes.

43. A method for manufacturing an electronic device including a PLZT film as defined in claim 39, wherein said initial layer has a thickness in a range of 1 nm–100 nm after crystallization thereof.

44. A method for manufacturing an electronic device including a PLZT film as defined in claim 30, further comprising the steps of:

forming on said $(Pb,La)(Zr,Ti)O_3$ film another amorphous $SrRuO_3$ film by sputtering without directly heating the substrate; and performing heat treatment on said another $SrRuO_3$ film at a temperature high enough for $SrRuO_3$ to crystallize, thereby polycrystallizing said another $SrRuO_3$ film.

45. A method for manufacturing an electronic device including a PLZT film as defined in claim 44, wherein each of said step of forming said $(Pb,La)(Zr,Ti)O_3$ film and said step of polycrystallizing said another $SrRuO_3$ film includes a step of performing heat treatment in an oxygen-containing atmosphere.

* * * * *